United States Patent [19]

Fraboni et al.

[11] 4,089,043

[45] May 9, 1978

[54] FRAME FOR PRINTED CIRCUIT CARDS

[75] Inventors: Gilbert Fraboni, Brignoud; Jean Neyroud, St-Martin-d'Heres, both of France

[73] Assignee: La Telemecanique Electrique, France

[21] Appl. No.: 729,916

[22] Filed: Oct. 5, 1976

[51] Int. Cl.² ............................................. H02B 1/02
[52] U.S. Cl. ................................................. 361/415
[58] Field of Search ................... 361/399, 415; 211/41

[56] References Cited

U.S. PATENT DOCUMENTS 3,838,777  10/1974  Thornicoft et al. ............... 361/415

FOREIGN PATENT DOCUMENTS 1,197,151  2/1960  Germany ........................... 361/415

Primary Examiner—David Smith, Jr.
Attorney, Agent, or Firm—William Anthony Drucker

[57] ABSTRACT

Chassis comprising cross members joined by slides intended to hold printed circuit boards. The end of the slides is shaped to engage in, and be centered between the arms of an extruded section, the cross-section of which resembles a spring clamp.

2 Claims, 3 Drawing Figures

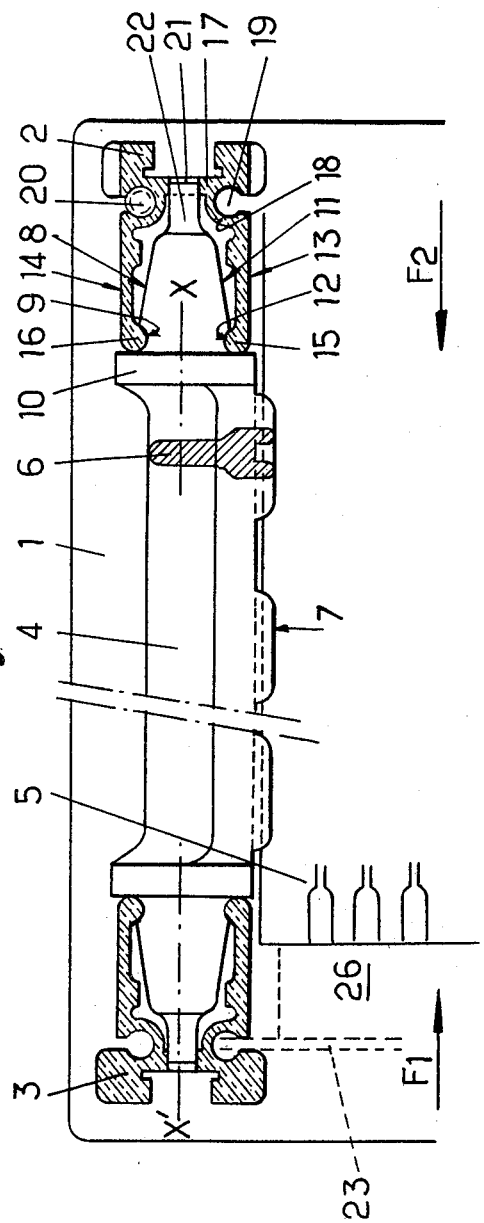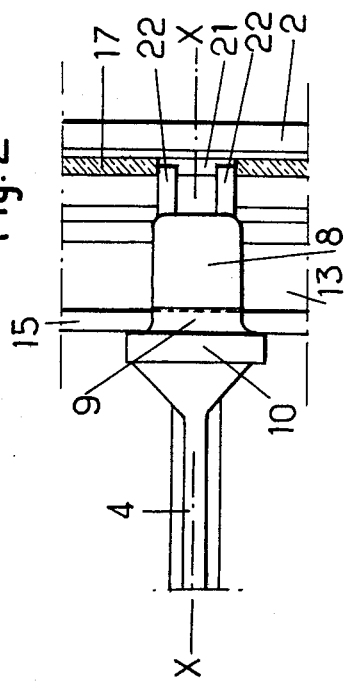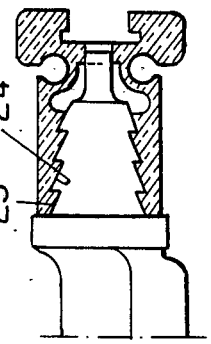

FRAME FOR PRINTED CIRCUIT CARDS

The invention concerns a chassis for a printed circuit board, comprising two side walls, between which are arranged two pairs of parallel cross-members, each with regular perforations which accomodate centering devices placed near the ends of the slides, which serve to guide and support the boards by their paralled edges.

Such chassis are used, in particular, in electronic, digital or analogue data processing systems.

Chassis already exist in accordance with previous art, defined above, in which the slides are made of a plastic material.

These chassis have the disadvantage that, owing to the high coefficient of expansion of the plastic materials, a deformation takes place when the circuits located in the chassis dissipate a certain quantity of heat; the rigidity of these slides may also be a disadvantage when, with a view to increasing the liability, increasing numbers of components are arranged on a single large printed circuit board, which leads to a significant increase in weight; finally, the heat dissipated by the increasing number of components has to be removed by natural or artificial ventilation, heat transfer to the metal of the chassis being made insignificant, owing to the extremely poor coefficient of conductivity of the plastic materials used for making the slide.

Chassis also exist in which all the slides are formed by stamping from a metal plate, with perforations through which the cooling air may circulate. A criticism of such an approach is that the area of the perforations is always smaller than the area of the space which can exist between two neighbouring slides and, secondly, using such a chassis implies that all the slides will be used, otherwise the production cost will be out of proportion with the density of equipment the chassis is to carry.

An object of the invention is, then, to provide a chassis consisting of separate metal slides in order to benefit from their advantages of good heat transmission, "as required" fitting, simple and rapid fitting and rigidity usually unsatisfactory in prior art involving such individual slides.

According to the invention, this result is obtained by means of the fact that the cross-section of the cross-members is in the form of a metal, spring clamp comprising rims 15, 16, and that at least one of the ends of each metal slide has at least one taper 8, 11, and one groove 9, 12, designed to open the arms 13, 14, of the clamp and engage on the bead.

Other special features and advantages will be given in the description below which is accompanied by the following FIG. 1, shows a section of a pair of cross-members, perpendicular to its longitudinal axis and close to a slide;

FIG. 2, gives a top view and half-section of the cross-member and a view of the end of a slide;

FIG. 3, illustrates another embodiment of a cross-member/slide assembly.

Referring to FIGS. 1 and 2, 1 is one of the side walls of the chassis, 2 and 3 are the two upper parallel cross-members joining the two side walls, and 4 the upper slide, 5 indicating the printed circuit board, to simplify the drawing, the lower slide and the two lower cross-members have not been shown.

The metal body of the slide 4 has lateral lugs at a certain interval as shown on the rotated section shown by 6. These lateral lugs serve to guide and hold the edge of the printed board in the vertical and transverse direction of the chassis, other means (not shown) being provided to prevent the board from sliding in the direction parallel to the slide.

Each end of the slide has at least one taper, such as 8, followed by a groove 9. The latter may be placed in close proximity to a shoulder 10. Preferably, other tapers and grooves 11, respectively 12, are located symmetrically with respect to a longitudinal axis XX' of the slide.

In section, the metal cross-member 2 appears as a clamp formed of two parallel arms 13, 14, at the end of each is a bead 15, 16 respectively, these two beads facing one another. The base of each arm is linked to a front part 17 by a wall, such as 18, of relatively low thickness, in order to give the clamp the necessary elasticity. In the example shown, this wall is curvilinear, which results first in the arm being longer, thus facilitating its deformation, and secondly in the formation of a cylindrical channel 19, parallel to the longitudinal axis of the cross-member. This channel will be used for attaching the ends of the cross-member to the lateral walls by means of 20 mm screws, the threaded part of which will be housed in the said channel.

The front part 17, of the cross-member has a series of equidistant openings 21, each of which houses an extention 22, of the end of the slides it is decided to use. The extension is visible in particular in FIG. 2.

In the example shown, the openings of the cross-member clamps are directed towards each other. It may be easily conceived that the clamps, instead of being arranged thus, could be arranged perpendicularly, on condition that the end of the slides were shaped accordingly.

In order to fit the slides to the cross-members, the number of slides chosen for a given application, are first arranged parallel on the working surface of a simple machine, and the two cross-members intended to retain them are then placed opposite their ends; a chuck device with two jaws is then moved in the direction of the arrows, F1 and F2 in order to put the clamps on the ends. During this operation, the arms of the clamps open out as they slide on the tapers so that the end beads finally engage at the grooves; the extent of penetration of the ends may be determined by the grooves themselves, or by the shoulder 10, while the penetration of the extentions 22, into the openings 21, retains the slide in a satisfactory position.

The contact between these parts is such as to give efficient grip and excellent rigidity, together with good heat transfer properties.

In the example illustrated on FIG. 3, the taper and the groove of the slide has been broken down into a series of teeth 24, while the series of beads 25, of complementary shape is provided on the arms of the clamp.

The slides are made by a casting process such as to give dimensional accuracy, for example, pressure molding; while the cross-members are made using the extrusion process, which is perfectly suited for the relatively complicated shape of the section.

The presence of the open channels 19, the opening of which is in a plane perpendicular to the longitudinal axis of the slides, may also be used for retaining other parts of the chassis, for example, they may support a wall 23, forming the bottom of the chassis on which will be arranged the connectors 26 for the printed circuits. The movements of such a wall may be limited by the lateral walls and the cross-members, if it is possible to tolerate reduced clearance which is, nevertheless, adequate to allow the ends of the printed circuit board to penetrate the connectors.

The parts of the chassis described above may be the subject of modifications without departing from the scope of the invention, for example, by a kinematic inversion whereby the arms of the clamp would be designed to be pressed together instead of being spread apart.

We claim:

1. A frame assembly for printed circuit boards comprising: two lateral walls; two pairs of parallel longitudinally extending metallic cross-members mounted between said lateral walls at right angles therewith and a plurality of transverse guide members supported by said cross-members, each of said cross-members having two substantially parallel resilient arms each provided at one end with a longitudinally extending bead, the beads of the said two arms facing one another and a common wall joining the said two arms at the opposite ends thereof and, provided with a plurality of regularly distributed openings, each of said guide members having at least at one end thereof, an extension adapted to enter one of said openings, and two inclined surface portions, at least one of said surface portions being provided with a longitudinally extending groove arranged for engaging on one of said beads, when the extension enters said opening.

2. A frame according to claim 1, wherein said parallel arms and said common wall partially encompass at least one open cylindrical longitudinally extending channel.

* * * * *